United States Patent
Yang et al.

(10) Patent No.: US 8,679,970 B2
(45) Date of Patent: Mar. 25, 2014

(54) STRUCTURE AND PROCESS FOR CONDUCTIVE CONTACT INTEGRATION

(75) Inventors: Chih-Chao Yang, Glenmont, NY (US); Lynne M. Gignac, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 373 days.

(21) Appl. No.: 12/124,698

(22) Filed: May 21, 2008

(65) Prior Publication Data

US 2009/0289365 A1 Nov. 26, 2009

(51) Int. Cl.
*H01L 23/48* (2006.01)
*H01L 21/02* (2006.01)
*H01L 21/768* (2006.01)

(52) U.S. Cl.
USPC 438/653; 257/751; 257/E23.01; 257/E21.476

(58) Field of Classification Search
USPC .............. 257/751, E23.01, E21.476; 438/653
See application file for complete search history.

(56) References Cited

U.S. PATENT DOCUMENTS

| | | | |
|---|---|---|---|
| 5,891,513 | A | 4/1999 | Dubin et al. |
| 6,143,645 | A | 11/2000 | Hsu et al. |
| 6,399,512 | B1 * | 6/2002 | Blosse et al. .................. 438/723 |
| 6,784,485 | B1 | 8/2004 | Cohen et al. |
| 7,086,138 | B2 | 8/2006 | Anderson |
| 7,112,508 | B2 | 9/2006 | Rhodes et al. |
| 7,214,602 | B2 | 5/2007 | Marsh |
| 7,365,001 | B2 | 4/2008 | Yang et al. |
| 7,727,890 | B2 | 6/2010 | Edelstein et al. |
| 7,951,714 | B2 | 5/2011 | Edelstein et al. |

(Continued)

FOREIGN PATENT DOCUMENTS

| | | |
|---|---|---|
| CA | 2349033 | 11/2002 |
| CA | 2039516 | 6/2003 |

(Continued)

OTHER PUBLICATIONS

Lin, QingHuang, et al., "Symposium B: Materials, Processes, Integration, and Reliability in Advanced Interconnects for Micro- and Nano-Electronics," Apr. 10-12, 2007, http://www.mrs.org/s_mrs/doc.asp?CID=8697&DID=193960. One Page.*

(Continued)

*Primary Examiner* — Alexander Sofocleous
*Assistant Examiner* — John P Dulka
(74) *Attorney, Agent, or Firm* — Scully, Scott, Murphy & Presser, P.C.; Louis J. Percello, Esq.

(57) ABSTRACT

A semiconductor structure including a highly reliable high aspect ratio contact structure in which key-hole seam formation is eliminated is provided. The key-hole seam formation is eliminated in the present invention by providing a densified noble metal-containing liner within a high aspect ratio contact opening that is present in a dielectric material. The densified noble metal-containing liner is located atop a diffusion barrier and both those elements separate the conductive material of the inventive contact structure from a conductive material of an underlying semiconductor structure. The densified noble metal-containing liner of the present invention is formed by deposition of a noble metal-containing material having a first resistivity and subjecting the deposited noble metal-containing material to a densification treatment process (either thermal or plasma) that decreases the resistivity of the deposited noble metal-containing material to a lower resistivity.

11 Claims, 9 Drawing Sheets

(56) References Cited

U.S. PATENT DOCUMENTS

| | | | |
|---|---|---|---|
| 2002/0121699 A1 | 9/2002 | Cheng et al. | |
| 2004/0203176 A1* | 10/2004 | Zhao et al. | 438/3 |
| 2005/0181598 A1* | 8/2005 | Kailasam | 438/654 |
| 2005/0200024 A1* | 9/2005 | Clevenger et al. | 257/759 |
| 2006/0128150 A1 | 6/2006 | Gandikota et al. | |
| 2006/0220248 A1* | 10/2006 | Suzuki | 257/751 |
| 2007/0099422 A1 | 5/2007 | Wijekoon et al. | |
| 2007/0166995 A1 | 7/2007 | Malhotra et al. | |
| 2007/0190780 A1 | 8/2007 | Chung et al. | |
| 2007/0216031 A1 | 9/2007 | Yang et al. | |
| 2007/0259519 A1 | 11/2007 | Yang et al. | |
| 2008/0057198 A1* | 3/2008 | Yoon et al. | 427/250 |
| 2008/0230906 A1 | 9/2008 | Wong et al. | |
| 2008/0237859 A1* | 10/2008 | Ishizaka et al. | 257/751 |
| 2008/0242088 A1* | 10/2008 | Suzuki | 438/687 |
| 2009/0087981 A1* | 4/2009 | Suzuki et al. | 438/643 |
| 2009/0246952 A1* | 10/2009 | Ishizaka et al. | 438/653 |

FOREIGN PATENT DOCUMENTS

| | | |
|---|---|---|
| WO | WO0004574 | 1/2000 |
| WO | WO2006016642 | 2/2006 |
| WO | WO2007099922 | 9/2007 |

OTHER PUBLICATIONS

Lin, Qinghuang, et al., "Symposium B: Materials, Processes, Integration, and Reliability in Advanced Interconnects for Micro- and Nano-Electronics," Apr. 10-12, 2007, http://www.mrs.org/s_mrs/doc.asp?CID=8697&DID=193960.

U.S. Appl. No. 12/034,708 entitled, "Structure and Process for Metallization in High Aspect Ratio Features," filed on Feb. 21, 2008, First Named Inventor: Chih-Chao Yang.

Supplemental European Search Report dated Oct. 12, 2012 received in a corresponding foreign application.

* cited by examiner

STRUCTURE AND PROCESS FOR CONDUCTIVE CONTACT INTEGRATION

RELATED APPLICATIONS

This application is related to co-pending and co-assigned U.S. patent application Ser. No. 12/034,708, filed Feb. 21, 2008.

FIELD OF THE INVENTION

The present invention relates to a semiconductor structure and a method of fabricating the same. More particularly, the present invention relates to a reliable conductive contact structure used in contacting an underlying semiconductor device to external components of a semiconductor chip. The present invention also provides a method of fabricating such a reliable conductive contact structure.

BACKGROUND OF THE INVENTION

A semiconductor device, such as, for example, a field effect transistor, is often formed with both back end of the line (BEOL) contacts to the gate and source/drain regions of the device to turn the device on/off and to allow current to flow through the device, respectively, and a middle of the line (MOL) contact to the body of the device between the source/drain regions to adjust threshold voltage (Vt).

Traditionally, conductive metals, such as tungsten (W) and aluminum (Al) have been deposited (e.g., by chemical vapor deposition (CVD), sputtering, etc.) into patterned openings (i.e., vias), which are present in the dielectric material of the contact (i.e., metallization) structure, to form both MOL and BEOL contacts. Recently, because of its lower electrical resistivity copper and copper alloys, which require plating, have become the preferred metal for filling the contact openings in both BEOL and MOL contact (i.e., metallization) structures.

Unfortunately, as circuit densities are increased, the aspect ratio (i.e., the ratio of height to width) for both BEOL and MOL contact (i.e., metallization) structures has increased and adequate plating of such high aspect ratio contact structures has proven difficult. Specifically, as circuit densities increase and device sizes are scaled, the width of both BEOL and MOL contact (i.e., metallization) structures is decreased; however, the thickness of the dielectric layers in which these contacts are formed has remained the same (i.e., contact or metallization structures with high height to width ratios). For example, circuit designers currently require MOL and BEOL contacts with aspect ratios that are greater 6:1 and oftentimes greater than 10:1. When conventional plating techniques are used to fill these high aspect ratio openings, seams and voids (collectively referred to as a key-hole seam) develop within the contact (i.e., metallization) structure.

FIG. 1 is a prior art semiconductor structure 10 which includes a contact (i.e., metallization) structure 20. As shown, the prior art structure 10 includes a field effect transistor (FET) 12 including a material stack 14 comprising at least a gate dielectric and an overlying gate conductor; both are not specifically shown or labeled but are collectively meant to be included within material stack 14. The material stack 14, which is patterned, also has an upper surface 15 that comprises a metal semiconductor alloy, i.e., a metal silicide or metal germanide, contact. The FET is located on a surface of a semiconductor substrate (not specifically shown) in which the source/drain regions are present. The FET 12 includes at least one spacer 16 located on exposed sidewalls of the material stack 14. The contact structure 20 includes a dielectric material 22 having a high aspect contact opening that is filled with a conductive metal 24 such as W, Al or Cu which is in contact with the upper surface 15 (i.e., the metal semiconductor alloy) of the material stack 14.

As is shown, and since prior plating processes have been used in forming the contact structure, a key-hole seam (represented by reference numeral 26) is present in the prior art contact structure. The presence of the key-hole seam negatively affects contact performance and, as such, the formation of the same in a contact structure should be avoided.

It is further noted that in prior art contact (i.e., metallization) structures such as shown in FIG. 1 there is also a farther reliability concern since the conductive metal 24 is in direct contact with the upper surface 15 (i.e., the metal semiconductor alloy) of the material stack 14.

In view of the above, there is a need for providing a new and improved high aspect ratio contact structure in which key-hole seam formation is avoided. That is, there is a need for providing a highly reliable high aspect ratio contact structure in which key-hole seam formation within a high aspect ratio opening of the contact structure is eliminated. Also, there is a further need for providing a contact structure in which the conductive metal of the contact structure does not come into direct contact with the underlying conductive material, e.g., a semiconductor alloy of a gate stack or a conductive metal of a lower interconnect level.

SUMMARY OF THE INVENTION

The present invention provides a semiconductor structure including a highly reliable high aspect ratio contact structure in which key-hole seam formation is eliminated. The key-hole seam formation is eliminated in the present invention by providing a densified noble metal-containing liner within a high aspect ratio contact opening that is present in a dielectric material. The densified noble metal-containing liner is located atop a diffusion barrier and both those elements separate the conductive material of the inventive contact structure from a conductive material (e.g., a metal semiconductor alloy of a material stack or a conductive metal of a lower interconnect level) of an underlying semiconductor structure.

The densified noble metal-containing liner of the present invention is formed by deposition of a noble metal-containing material having a first density and subjecting the deposited noble metal-containing material to a densification treatment process that increases the first density of the deposited noble metal-containing material to a second, higher density. The densification treatment process employed in the present invention may comprise thermal treatment or plasma treatment. It is further observed that the densified noble metal-containing liner of the present invention has a lower resistivity as compared to the as-deposited noble metal-containing material.

In one aspect, the invention provides a semiconductor structure that comprises:
at least one semiconductor structure located on a surface of a semiconductor substrate, said at least one semiconductor structure including an upper surface that is comprised of a conductive material;
a dielectric material located on said surface of said semiconductor substrate, said dielectric material including a contact opening that extends to the upper surface of said conductive material of said at least one semiconductor structure, and said contact opening having an aspect ratio of greater than 3:1;

a diffusion barrier present within said contact opening, said diffusion barrier lines sidewalls of said contact opening and has a bottom portion that is located atop said upper surface of said conductive material;
a densified noble metal-containing liner present on said diffusion barrier within said contact opening; and
a conductive metal-containing material located atop said densified noble metal-containing liner within said contact opening.

In one embodiment of the inventive structure, the at least one semiconductor structure is a transistor and said conductive material of said at least one semiconductor structure is a metal semiconductor alloy that is located on an upper surface of a material stack of the transistor.

In another embodiment of the inventive structure, the at least one semiconductor structure is an interconnect level and said conductive material of said at least one semiconductor structure is located within a dielectric material.

Notwithstanding the type of semiconductor structure employed, the densified noble metal-containing liner comprises one of Ru, Rh, Ir, Pt, Co, Pd and alloys thereof, the conductive metal-containing material is one of Cu, W, and Al, and the diffusion barrier comprises one of Ta, TaN, Ti, TiN, Ru, RuN, RuTa, RuTaN, W, and WN.

In another aspect of the invention, a method of forming a semiconductor structure is provided that comprises:
providing at least one semiconductor structure located on a surface of a semiconductor substrate, said at least one semiconductor structure including at least an upper surface that is comprised of a conductive material;
forming a dielectric material on said surface of said semiconductor substrate, said dielectric material including a contact opening that extends to the upper surface of said conductive material, and said contact opening having an aspect ratio of greater than 3:1;
forming a diffusion barrier at least within said contact opening, said diffusion barrier lining sidewalls of said contact opening and covering said upper surface of said conductive material of said at least one semiconductor structure;
forming a densified noble metal-containing material on said diffusion barrier at least within said contact opening; and
providing a conductive metal-containing layer atop said densified noble metal-containing material at least within said contact opening.

In one embodiment of the inventive method, the at least one semiconductor structure is a transistor and said conductive material of said at least one semiconductor structure is a metal semiconductor alloy that is located on an upper surface of a material stack of the transistor.

In another embodiment of the inventive method, the at least one semiconductor structure is an interconnect level and said conductive material of said at least one semiconductor structure is located within a dielectric material.

Notwithstanding the type of semiconductor structure employed, the densified noble metal-containing material is formed by deposition of a noble metal-containing material and then subjecting the as-deposited noble metal-containing material to a densification treatment via either a plasma process or a thermal process.

The densification treatment used to densify the as-deposited noble metal-containing material is performed in a $H_2$-containing environment. The $H_2$-containing environment may be used alone i.e., neat, or it may be admixed with an inert gas such as, for example, He, Ar, Ne, Kr, Xe, $N_2$ or mixtures thereof. In one preferred embodiment, the environment employed to densify the as-deposited noble metal-containing layer is a $H_2$-containing gas that is mixed with Ar. A preferred ratio is 95% $H_2$ with 5% Ar. The densification process could be done either through a plasma process or a thermal process.

After providing a conductive metal-containing layer, the method of the present invention performs a planarization step that forms a contact structure including a U-shaped diffusion barrier, a U-shaped densified noble metal-containing liner, and a conductive metal-containing layer each of which have an upper surface that is coplanar with an upper surface of the dielectric material.

DETAILED DESCRIPTION OF THE INVENTION

The present invention, which provides a highly reliable high aspect ratio contact structure and a method of fabricating the same, will now be described in greater detail by referring to the following discussion and drawings that accompany the present application. It is noted that the drawings that accompany the present application are provided for illustrative purposes only, and, as such, these drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides a highly reliable high aspect contact structure in which the formation of a key-hole seam within a high aspect ratio contact opening, particularly at an area of the high aspect ratio contact opening that is in close proximity to upper surface of a conductive material of a semiconductor structure, is eliminated.

Figure 2A:
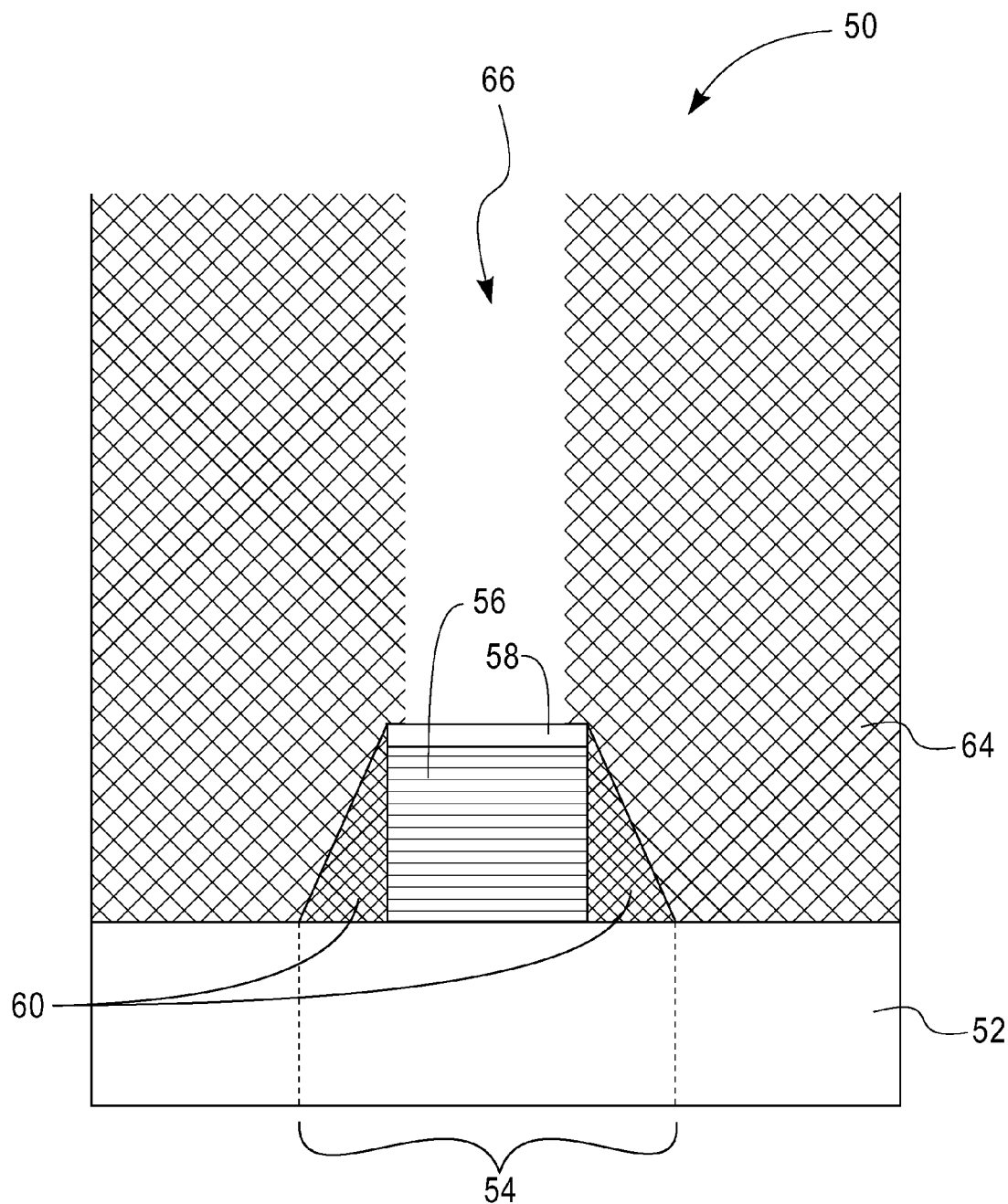
FIGS. 2A-2G are pictorial representations (through cross sectional views) illustrating an embodiment of the present invention for forming a reliable high aspect ratio contact structure in which key-hole seam production is avoided.

Reference is now made to FIGS. 2A-2G which are pictorial representations (through cross sectional views) illustrating one embodiment of the present invention for forming a reliable high aspect ratio contact structure. FIG. 2A illustrates an initial structure 50 that can be employed in one embodiment of the present invention.

Figure 3:
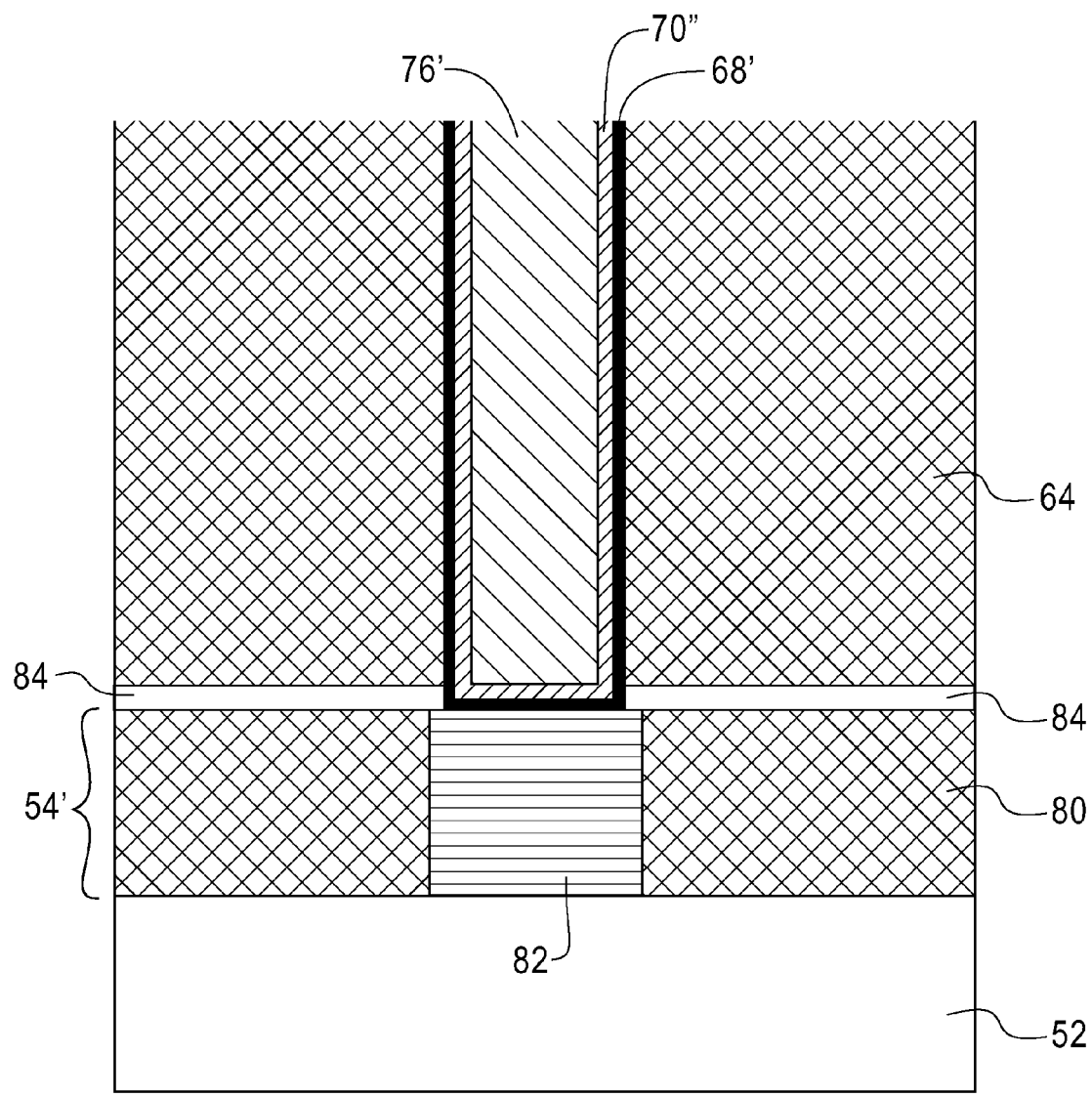
FIG. 3 is a pictorial representation (through a cross sectional view) illustrating another embodiment of the present invention.

The initial structure 50 of this embodiment of the invention includes a semiconductor substrate 52 having at least one semiconductor structure 54 located thereon. In accordance with the present invention, the at least one semiconductor structure 54 includes a material stack 56 having an upper surface 58 that comprises a metal semiconductor alloy (i.e., a silicide or germanide). It is noted that in the drawings, the one semiconductor structure 54 is depicted as a field effect transistor (FET). Although such a semiconductor structure 54 is depicted and illustrated, the present invention also contemplates other semiconductor structures including, for example, capacitors, diodes, bipolar transistors, BiCMOS devices, memory devices and the like which include a patterned material stack having an upper surface that is comprised of a metal semiconductor alloy or another conductive material such as a metal or metal alloy. FIG. 3 also illustrates another embodiment in which the semiconductor structure is an underlying interconnect level including a dielectric material having a conductive material embedded therein. Also, although illustration is made to a patterned material stack, the present invention also works in embodiments in which the material stack is non-patterned.

The term "semiconductor substrate" is used throughout this application to denote any semiconducting material including, for example, Si, SiGe, SiGeC, SiC, Ge alloys, GaAs, InAs, InP and other III/V or II/VI compound semiconductors. In addition to these listed types of semiconducting materials, the present invention also contemplates cases in which the semiconductor substrate 52 is a layered semiconductor such as, for example, Si/SiGe, Si/SiC, silicon-on-insulators (SOIs) or silicon germanium-on-insulators (SGOIs). In some embodiments of the present invention, it is preferred that the semiconductor substrate 52 be composed of a Si-containing semiconductor material, i.e., a semiconductor material that includes silicon. The semiconductor substrate 52 may be doped, undoped or contain doped and undoped regions therein.

It is also noted that the semiconductor substrate 52 may be strained, unstrained or contain strained regions and unstrained regions therein. The semiconductor substrate 52 may also have a single crystal orientation or alternatively, the substrate 52 may be a hybrid semiconductor substrate that has surface regions having different crystallographic orientations. The semiconductor substrate 52 may also have one or more isolation regions such as, for example, trench isolation regions or field oxide isolation regions, located therein.

Next, the at least one semiconductor structure 54 including a material stack 56 (patterned or non-patterned) having an upper surface 58 that comprises a metal semiconductor alloy is formed. The at least one semiconductor structure 54 is formed utilizing conventional techniques that are well known to those skilled in the art. The processing details may vary depending on the type of structure being fabricating. In the case of a field effect transistor, deposition, lithography, etching and ion implantation can be used in forming the field effect transistor. Alternatively, a replacement gate process can be used in forming the field effect transistor.

In the case of a field effect transistor, the material stack 56 further includes a gate dielectric (not specifically shown or labeled) and an overlying gate conductor (not specifically shown or labeled). The FET also includes at least one spacer 60 located on exposed sidewalls of the material stack 56, and source/drain regions (not specifically shown or labeled) located within the semiconductor substrate 52 at the footprint of the material stack 56. The gate dielectric, the gate conductor and the spacer 60 are comprised of conventional materials. For example, the gate dielectric is comprised of an oxide, nitride, oxynitride or combinations and multilayers thereof. The gate conductor is comprised of polySi, SiGe, an elemental metal, an alloy including an elemental metal, a metal silicide, a metal nitride or any combination including multilayers thereof. The spacer 60, which is optional, is comprised of an oxide, a nitride, an oxynitride or any combination, including multilayers thereof.

The metal semiconductor alloy that is located at the upper surface 58 of material stack 56 is formed utilizing a standard salicidation ('self-aligned') process well known in the art. This includes forming a metal capable of reacting with a semiconductor material atop the entire structure, forming a barrier layer atop the metal, heating the structure to form a metal semiconductor alloy, removing non-reacted metal and the barrier layer and, if needed, conducting a second heating step. When a semiconductor material is not present, a layer of a semiconductor-containing material can be formed prior to forming the metal. The second heating step is required in those instances in which the first heating step does not form the lowest resistance phase of the metal semiconductor alloy. The metal used in forming the metal semiconductor alloy comprises one of Ti, Ni, Pt, W, Co, Ir, and the like. Alloying additives can also be present as desired. The heating, i.e., anneal, step used in forming the metal semiconductor alloy includes conditions that are well known to those skilled in the art. It is noted that during the formation of the metal semiconductor alloy layer atop the material stack, a metal semiconductor alloy can be also formed on any exposed surfaces of the semiconductor substrate in which the metal was formed.

The initial structure 50 shown in FIG. 2A also includes a dielectric material 64 including a contact opening 66. As shown, the contact opening 66 exposes the upper surface 58 (i.e., the metal semiconductor alloy) of the material stack 56.

The dielectric material 64 may comprise any dielectric used in middle of the line (MOL) and/or back end of the line (BEOL) applications. The dielectric material 64 may be porous or non-porous. Some examples of suitable dielectrics that can be used as the dielectric material 64 include, but are not limited to: $SiO_2$, a doped or undoped silicate glass, C doped oxides (i.e., organosilicates) that include atoms of Si, C, O and H, silsesquioxanes, thermosetting polyarylene ethers, or multilayers thereof, silicon nitride, silicon oxynitride or any combination, including multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. In one embodiment, the dielectric material 64 is $SiO_2$ that is formed from a TEOS (tetraethylorthosilane) precursor.

The dielectric material 64 typically has a dielectric constant that is about 4.0 or less, with a dielectric constant of about 2.8 or less being even more typical. The thickness of the dielectric material 64 may vary depending upon the dielectric material used. Typically, and for normal MOL and/or BEOL applications, the dielectric material 64 has a thickness from about 200 to about 450 nm.

The contact opening 66 that is present within the dielectric material 64 is formed by lithography and etching. The lithographic process includes forming a photoresist (not shown) atop the dielectric material 64, exposing the photoresist to a desired pattern of radiation and developing the exposed photoresist utilizing a conventional resist developer. The etching process includes a dry etching process (such as, for example, reactive ion etching, ion beam etching, plasma etching or laser ablation), or a wet chemical etching process that selectively removes the exposed dielectric material 64. Typically, reactive ion etching is used in providing the contact opening 66. After etching, the photoresist is typically removed utilizing a conventional resist stripping process well known to those skilled in this art. As shown, the contact opening 66 has sidewalls. The sidewalls within the contact opening 66 may be substantially vertical, as shown, or some tapering may be evident. The contact opening 66 typically has an aspect ratio that is greater than 3, preferably greater than 5, more preferably greater than 10:1. The contact opening 66 may be referred to in the art as a via opening.

Figure 2B:
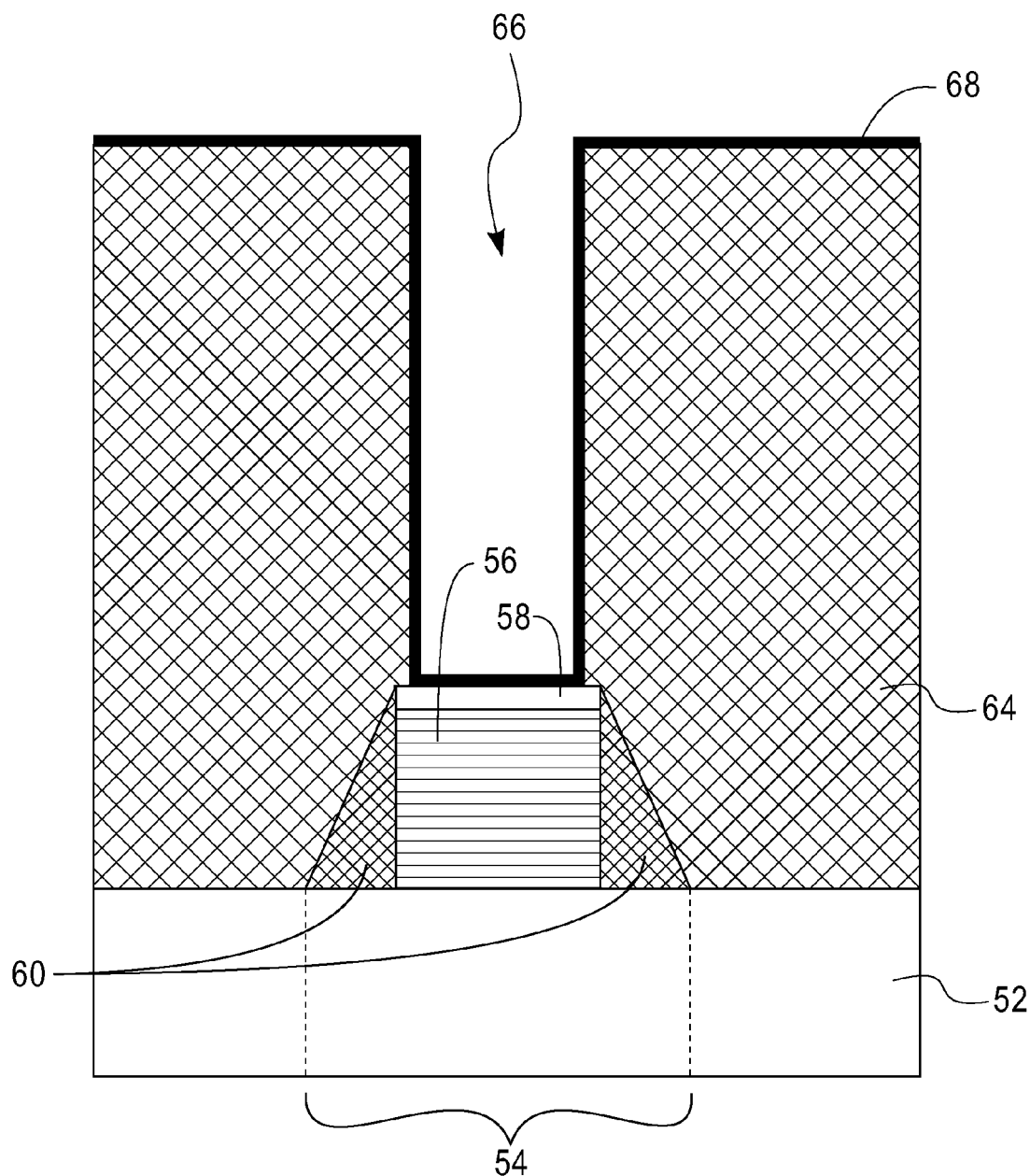

After providing the initial structure 50 shown in FIG. 2A, a diffusion barrier 68 is formed within the contact opening 66 and atop dielectric material 64 providing the structure shown in FIG. 2B. As is illustrated in FIG. 2B, the diffusion barrier 68 covers the sidewalls of the contact opening 66 as well as a portion of the upper exposed surface 58 (i.e., the metal semiconductor alloy) of the material stack 56.

The diffusion barrier 68 comprises Ta, TaN, Ti, TiN, Ru, RuN, RuTa, RuTaN, W, WN or any other material that can serve as a barrier to prevent a conductive material from diffusing there through. The thickness of the diffusion barrier 68 may vary depending on the deposition process used as well as the material employed. Typically, the diffusion barrier 68 has a thickness from about 2 to about 50 nm, with a thickness from about 5 to about 20 nm being more typical.

The diffusion barrier 68 is formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

Figure 2C:
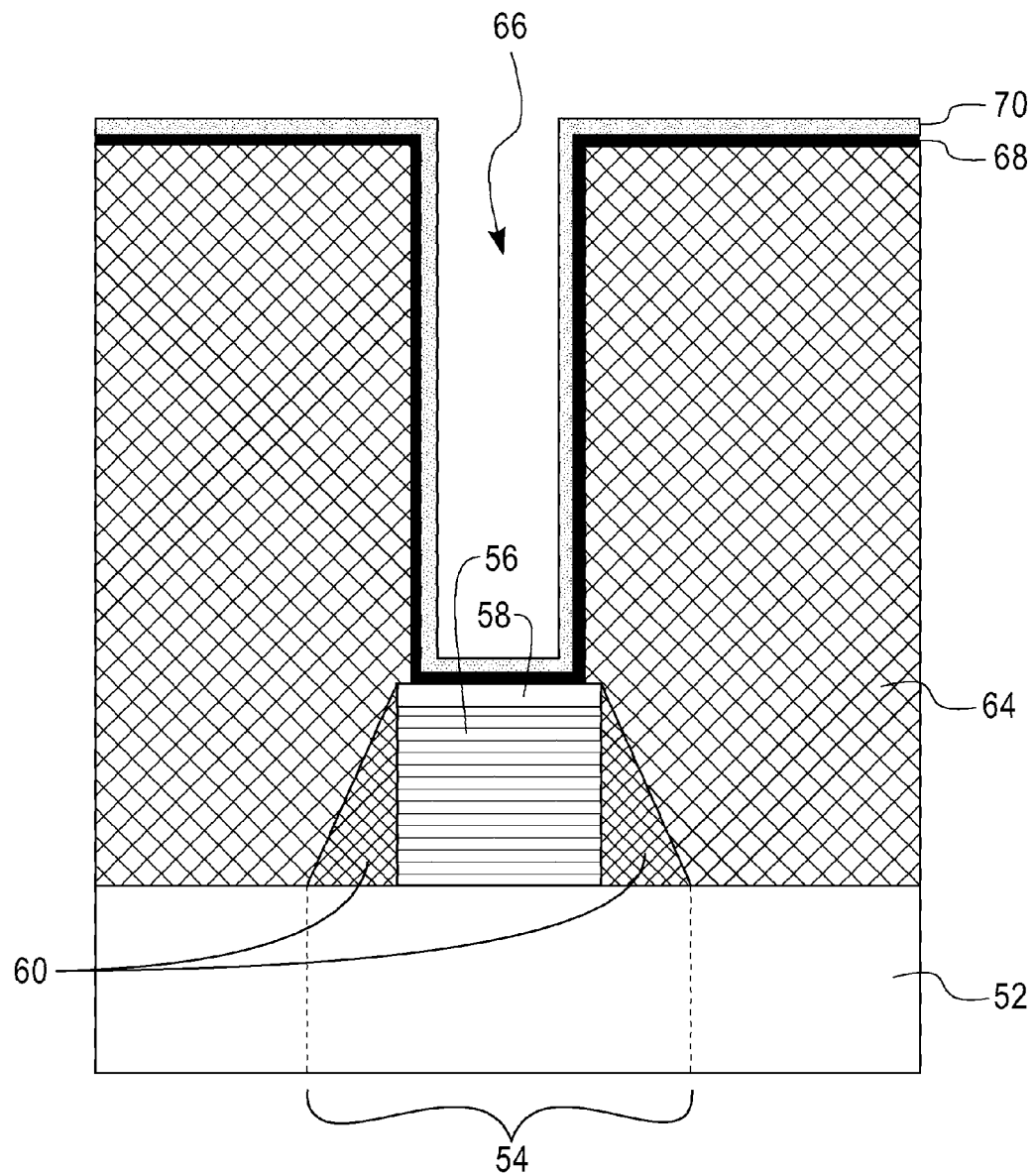

Next, and as shown in FIG. 2C, a noble metal-containing material 70 is deposited on the upper surface of the diffusion barrier 68. The noble metal containing material 70 includes any metal or metal alloy that is resistant to corrosion or oxidation. Moreover, the noble metal-containing material 70 employed in the present invention includes any metal or metal alloy which is lower in the "Galvanic Series" than the underlying metal semiconductor alloy layer (or other like conductive material in other embodiments) and the overlying conductive metal-containing material to be subsequently formed. Typically, the noble metal-containing material 70 comprises one of Ru, Rh, Irf, Pt, Co, Pd and alloys thereof, with Ru being highly preferred in some embodiments of the present invention. It is noted that the as-deposited noble metal-containing material 70 has a first density and a first resistivity associated therewith. The first density and the first resistivity of the noble metal-containing material 70 may vary depending on the type of material used in forming the same. The thickness of the as-deposited noble metal-containing material 70 is typically from about 10 to about 100 Å, preferably from about 20 to about 30 Å. Within that thickness range, the as-deposited noble metal-containing material 70 has a first electrical resistivity of above 80 micro-ohm cm.

The noble metal-containing material 70 is formed by a deposition process such as, for example, chemical vapor deposition (CVD), plasma enhanced chemical vapor deposition (PECVD), atomic layer deposition (ALD), and plasma enhanced atomic layer deposition (PEALD). The precursors and conditions for the deposition, which are well known to those skilled in the art, may vary depending on the exact deposition process used in forming the noble metal-containing material 70.

Figure 2D:
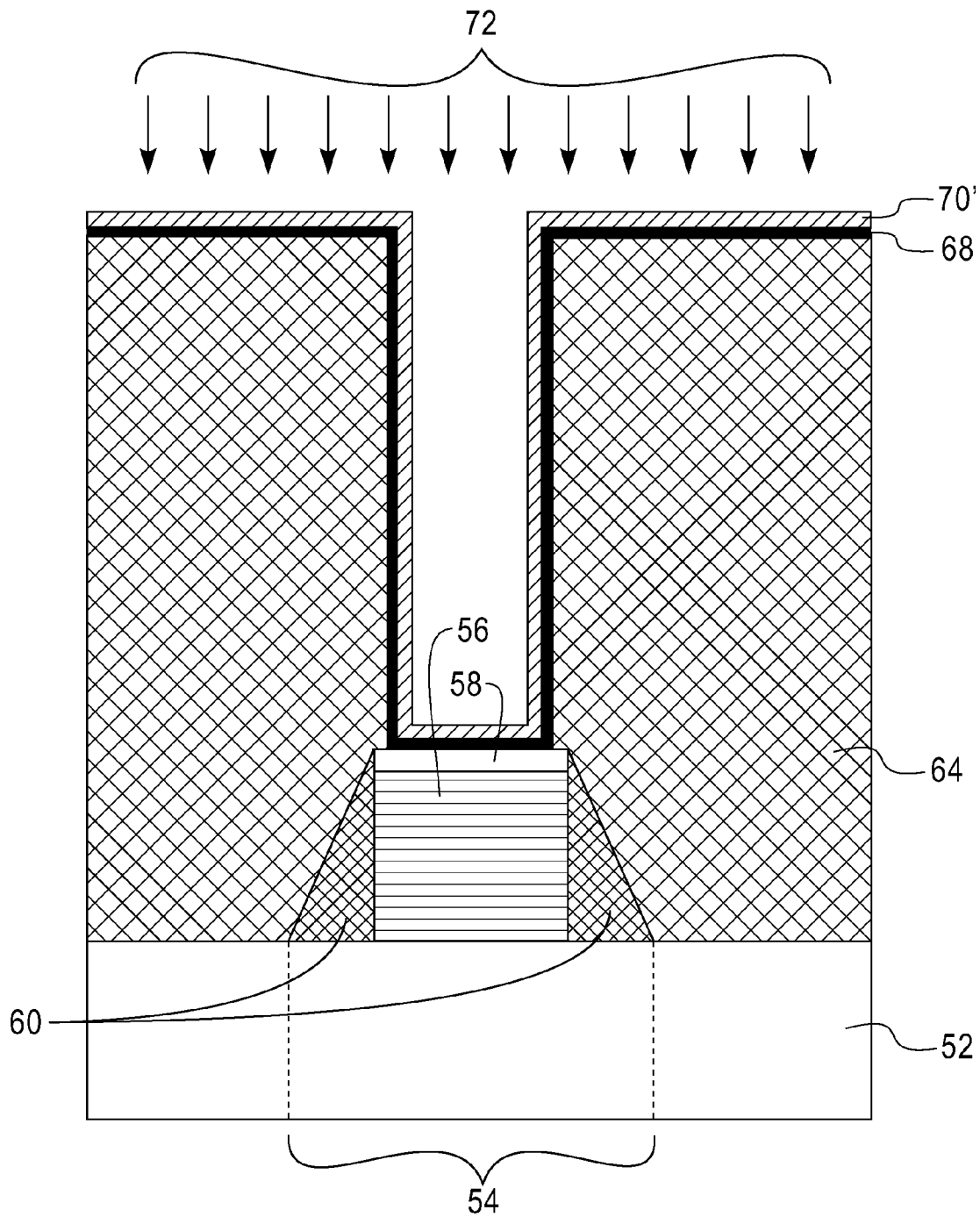

Next, and as is illustrated in FIG. 2D, the noble metal-containing material 70 is subjected to a densification treatment process that is capable of increasing the density of the as-deposited noble metal-containing material 70. The densification treatment process may comprise thermal treatment or plasma treatment. In FIG. 2D, reference numeral 72 denotes the densification treatment process, while reference numeral 70' denotes the treated (and thus now densified) noble metal-containing material. It is observed that the treated noble metal-containing material 70' has a lower resistivity than the as deposited noble metal-containing material 70.

The densification treatment (either thermal or plasma) is performed in a $H_2$-containing environment. The $H_2$-containing environment may be used neat or it may be admixed with an inert gas such as, for example, He, Ar, Ne, Kr, Xe, $N_2$ or mixtures thereof. In one preferred embodiment, the treatment employed to densify the as-deposited noble metal-containing layer is a $H_2$-containing environment that is mixed with Ar. A preferred ratio is 95% $H_2$ with 5% Ar. The densification process could be done either through a plasma process or a thermal process.

The densification treatment process used to density the as-deposited noble metal-containing material 70 is performed utilizing any conditions in which a hydrogen-containing environment (e.g., gaseous or plasma) can be used to increase the density of the as-deposited noble metal-containing material 70. Typically, the densification treatment employed in the present invention is performed at an elevated temperature that is typically within a range from about 100° to about 500° C., with a temperature from about 150° to about 450° C. being even more typical. The duration of the densification treatment may vary depending on the type of noble metal-containing material being subjected to said treatment. Typically, the duration of the densification treatment is from about 1 to about 20 minutes, with a duration from about 2 to about 5 minutes being even more typical.

As mentioned above, the densification treatment increases the density of the as-deposited noble metal-containing material 70. Moreover, the densification treatment decreases the resistivity of the as-deposited noble metal-containing material 70. With respect to the resistivity of the treated noble metal-containing material 70', the plasma treated noble metal-containing material 70' typically has a resistivity below 60 micro-ohm cm for the thickness range mentioned above.

Figure 2E:
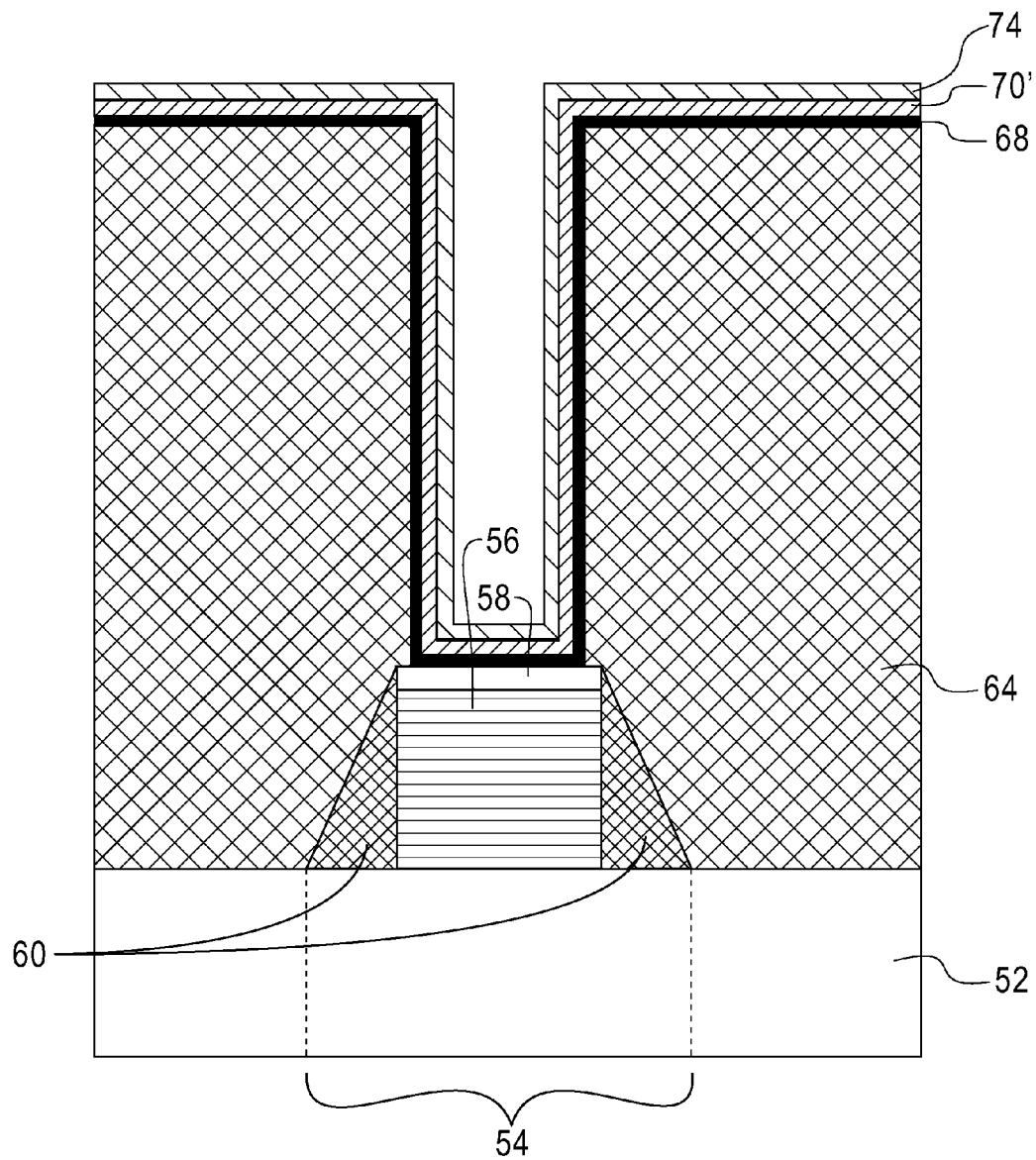

Next, and as shown in FIG. 2E, an optional plating seed layer 74 can be formed on the surface of the treated noble metal-containing material 70'. In cases in which the conductive material to be subsequently formed does not involve plating, the optional plating seed layer 74 is not needed. The optional plating seed layer 74 is employed to selectively promote subsequent electroplating of a pre-selected conductive metal or metal alloy. The optional plating seed layer 74 may comprise Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the opening 66.

The thickness of the optional seed layer 74 may vary depending on the material of the optional plating seed layer as well as the technique used in forming the same. Typically, the optional plating seed layer 74 has a thickness from about 2 to about 80 nm.

When present, the optional plating seed layer 74 is formed by a conventional deposition process including, for example, CVD, PECVD, ALD, and physical vapor deposition (PVD).

Figure 2F:
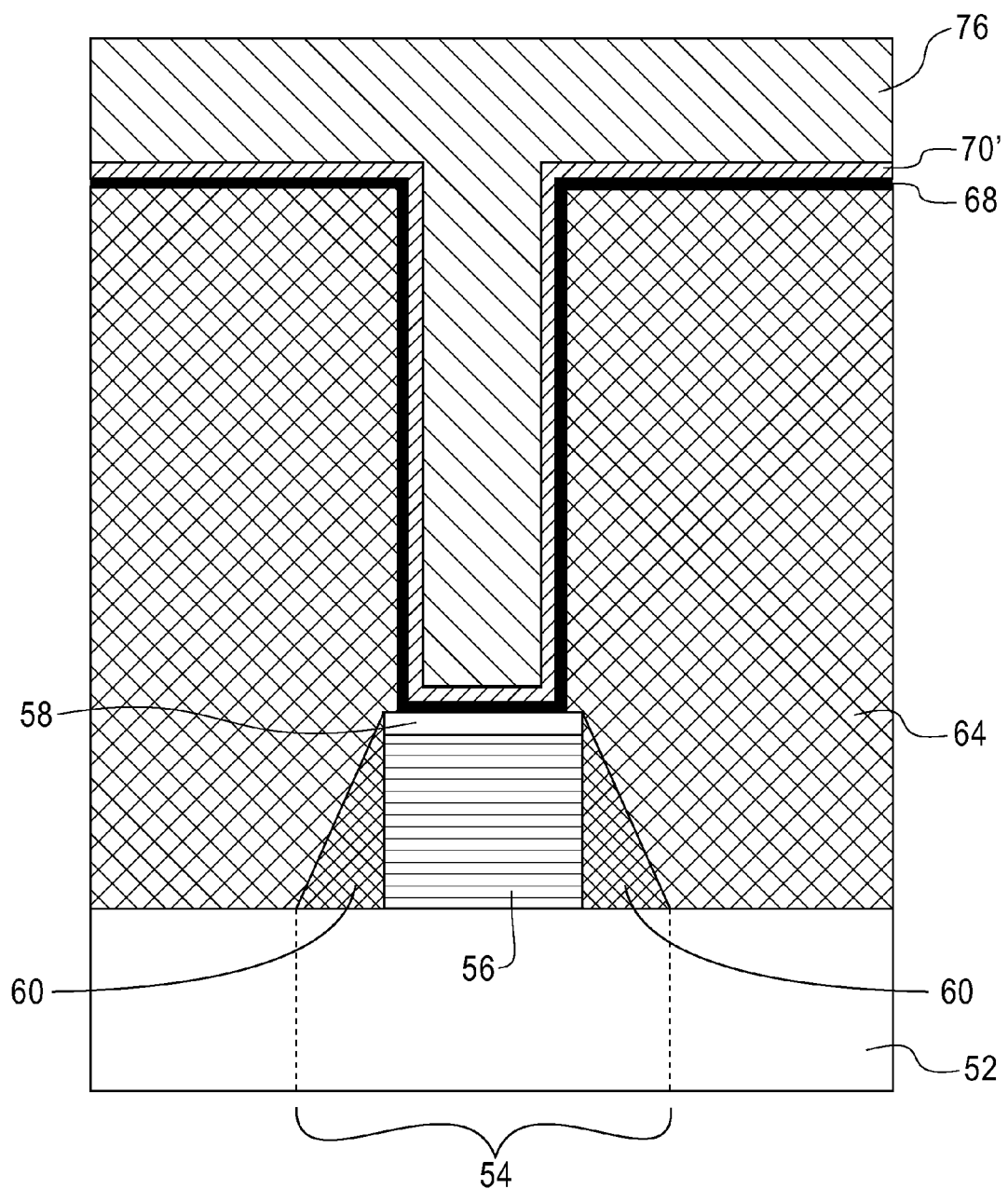

A conductive metal-containing layer 76 is then formed within the opening 66 as well as atop the surface of any of the optional plating seed layer 74 or the treated noble metal-containing material 70' that extends beyond the opening 66 providing the structure shown in FIG. 2F. The conductive metal-containing layer 76 employed in the present invention includes for example, a conductive metal, an alloy comprising at least one conductive metal, a metal silicide or any combination thereof. Preferably, the conductive metal-containing metal comprises a conductive metal such as, for example, Cu, W or Al, with Cu and W being highly preferred. The conductive metal-containing layer 76 can be formed utilizing a conventional deposition process such as, for example, CVD, PECVD, ALD, PEALD, sputtering, chemical solution deposition or plating (electro or electroless). In one embodiment of the present invention, and when the conductive metal-containing layer 76 comprises Cu, electroplating is used in forming the Cu layer. In another embodiment, and when the conductive metal-containing layer 76 comprises W, CVD or PECVD is used in forming the W layer.

Figure 2G:
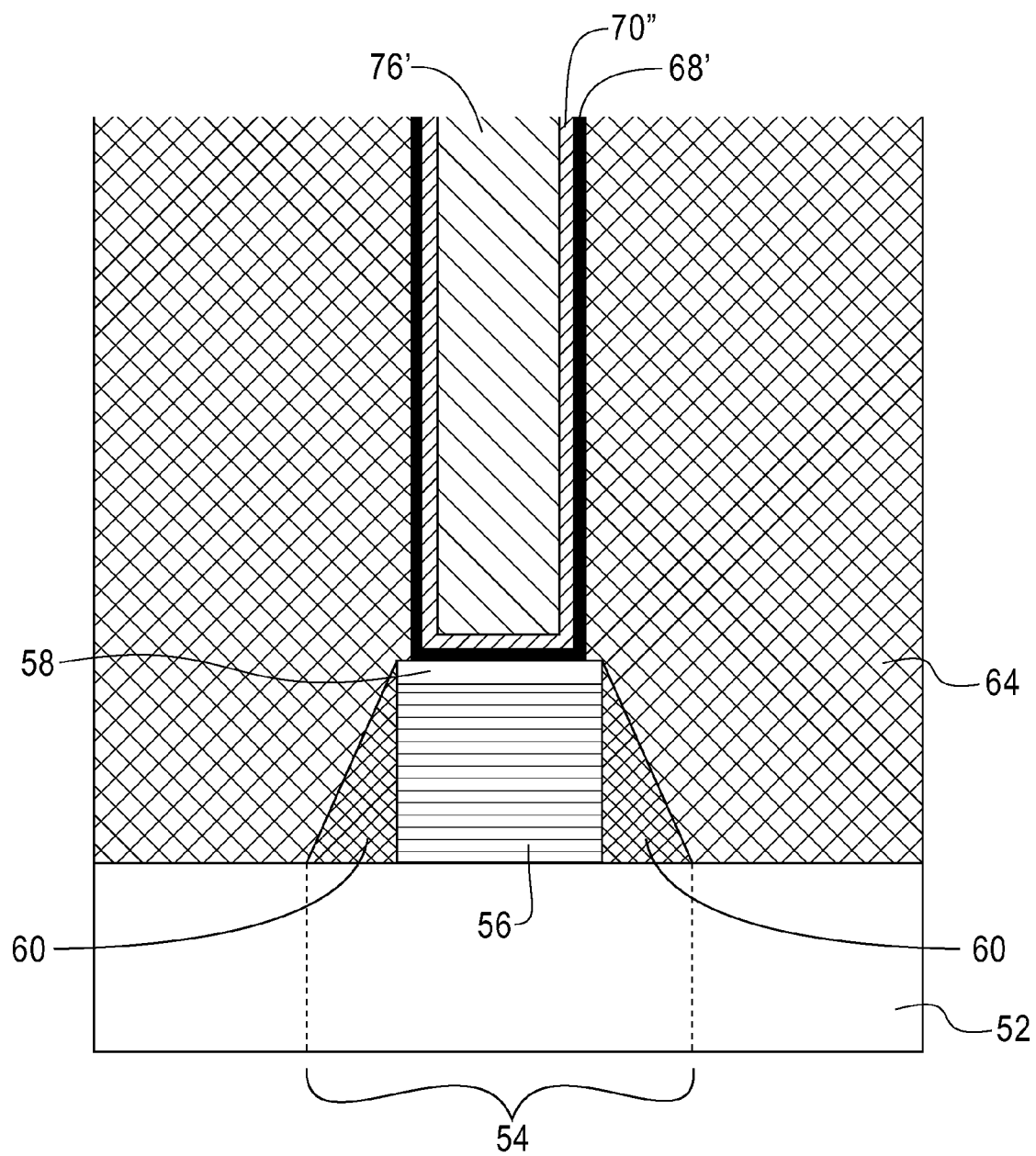

It is noted that in FIG. 2F and FIG. 2G the optional plating seed layer is not shown since it becomes a portion of the conductive metal-containing layer 76.

After deposition of the conductive metal-containing layer 76, the structure shown in FIG. 2F is subjected to a conventional planarization process providing the structure shown, for example, in FIG. 2G. Conventional planarization processes that can be employed in the present invention in providing the planar structure shown in FIG. 2G include chemical mechanical polishing (CMP), grinding, or a combination of CMP and grinding. In FIG. 2G, reference numeral 76' denotes the remaining conductive metal-containing layer that is present within the contact opening 66, reference numeral 70" denotes the densified noble metal-containing liner of the present invention, and reference numeral 68' denotes a U-shaped diffusion barrier. It is noted that planarization provides a structure in which the upper surface of each of the dielectric material 64, the U-shaped diffusion barrier 68', the densified noble metal-containing layer 70", and the remaining conductive metal-containing layer 76' is coplanar with each other. It is further observed that the densified noble metal-containing layer 70" has a U-shape after planarization as well.

Figure 1:
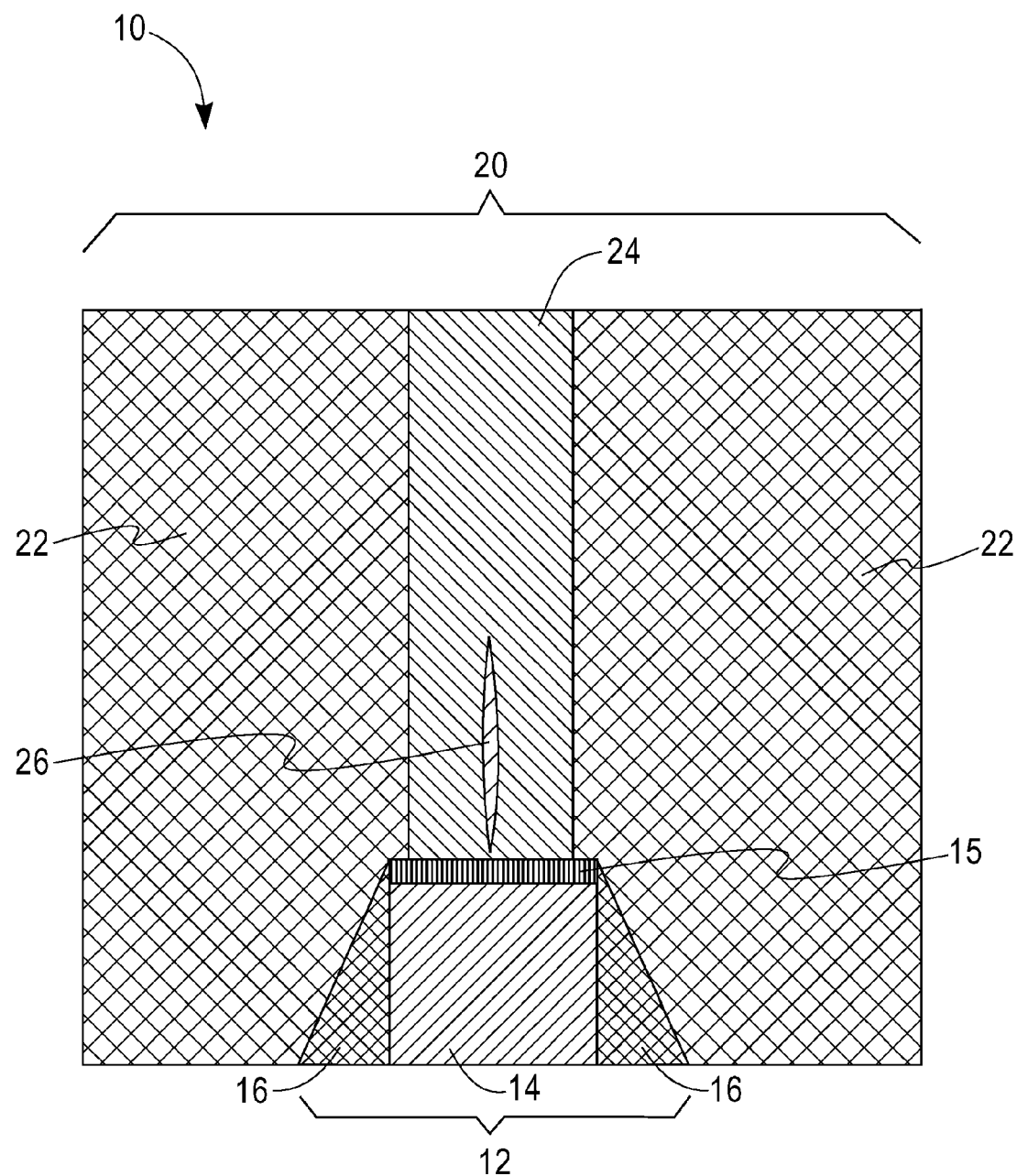
FIG. 1 is a pictorial representation (through a cross sectional view) illustrating a prior art high aspect ratio metal plated contact structure in which a key-hole seam is inherently present.

The contact structure shown in FIG. 26 is unlike prior art contact structures such as the one illustrated in FIG. 1 in that key-hole seam production is avoided. The production of key-hole seams within the inventive contact structure is believed to be avoided due to the employment of the densified noble metal-containing liner 70". Additionally, in the inventive contact structure, the conductive metal-containing layer 76' does not come into direct contact with the underlying upper surface 58 of material stack 56. Instead, the conductive metal-containing layer 76' is separated from the underlying upper surface 58 of material stack 56 by the bottom portion of the U-shaped diffusion barrier 68' as well as the bottom portion of the densified noble metal-containing liner 70".

FIG. 3 illustrates another embodiment of the present invention. In this embodiment of the present invention, the at least one semiconductor structure 54' is an interconnect level including a dielectric material 80 and a conductively filled via 82. An optional dielectric capping layer 84 may be located between the dielectric material 80 and the dielectric material 64. The dielectric material 80 may comprise the same or different dielectric material as dielectric material 64. Also, the conductively filled via 82 may comprise the same or different conductive material as conductive metal-containing layer 76. The at least one semiconductor structure 54' is formed utilizing conventional techniques including deposition, lithography and etching. The dielectric capping layer 84 mat comprise any suitable dielectric capping material such as, for example, SiC, $Si_4NH_3$, $SiO_2$, a carbon doped oxide, a nitrogen and hydrogen doped silicon carbide SiC(N,H) or multilayers thereof. Any conventional deposition process such as, for example, chemical vapor deposition, plasma enhanced chemical vapor deposition, chemical solution deposition, evaporation, and atomic layer deposition may be used in forming the dielectric capping layer 84. The thickness of the dielectric capping layer 84 may vary depending on the technique used to form the same as well as the material make-up of the layer. Typically, the dielectric capping layer 84 has a thickness from about 15 to about 100 nm, with a thickness from about 25 to about 45 nm being more typical.

After providing the at least one semiconductor structure 54' and forming the dielectric capping layer 84 thereon as shown in the lower portion of FIG. 3, the processing steps described above are performed to form the inventive contact structure. It is observed that the dielectric capping layer 84 is opened during formation of the at least one opening 66 within dielectric material 64.

The contact structure shown in FIG. 3 does not include any key-hole seam production therein. The production of key-hole seams within the inventive contact structure is believed to be avoided due to the employment of the densified noble metal-containing liner 70". Additionally, in the inventive contact structure, the conductive metal-containing layer 76' does not come into direct contact with the underlying upper conductive material 82 of the interconnect structure (i.e., the at least one semiconductor structure 54'). Instead, the conductive metal-containing layer 76' is separated from the conductive material 82 of the interconnect structure by the bottom portion of the U-shaped diffusion barrier 68' as well as the bottom portion of the densified noble metal-containing liner 70".

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:

providing at least one semiconductor structure located on a surface of a semiconductor substrate, said at least one semiconductor structure including at least an upper surface that is comprised of a conductive material;

forming a dielectric material on said surface of said semiconductor substrate, said dielectric material including a contact opening that extends to the upper surface of said conductive material, and said contact opening having an aspect ratio of greater than 3:1;

forming a diffusion barrier at least within said contact opening, said diffusion barrier lining sidewalls of said contact opening and covering said upper surface of said conductive material of said at least one semiconductor structure and said diffusion barrier is selected from the group consisting of Ta, TaN, Ti, TiN, Ru, RuN, RuTa, RuTaN, W and WN;

forming a hydrogen-densified noble metal-containing material on said diffusion barrier at least within said contact opening, wherein said hydrogen-densified noble metal-containing material has a resistivity below 60 micron-ohm cm for a thickness between 10 Å and 100 Å, wherein the hydrogen-densified noble metal-containing material is formed by first depositing a noble metal-containing material and then subjecting the deposited noble metal-containing material to densification utilizing a plasma process including a $H_2$-containing plasma;

forming a continuous plating seed layer on said hydrogen-densified noble metal-containing material at least within said contact opening;

providing a conductive metal-containing layer atop said continuous plating seed layer at least within said contact opening; and planarizing to provide a structure in which the diffusion barrier, said hydrogen-densified noble-metal-containing material, said continuous plating seed layer and said conductive metal-containing layer each have an upper surface that is coplanar with an upper surface of the dielectric material, wherein no key-hole seams are present in the conductive metal-containing material.

2. The method of claim 1 wherein the at least one semiconductor structure is a transistor and said conductive material of said at least one semiconductor structure is a metal semiconductor alloy that is located on an upper surface of a material stack of the transistor.

3. The method of claim 2 wherein said hydrogen-densified noble metal-containing liner is comprised of Ru and said conductive metal-containing material is comprised of Cu.

4. The method of claim 1 wherein the at least one semiconductor structure is an interconnect level and said conductive material of said at least one semiconductor structure is located within a dielectric material.

5. The method of claim 4 wherein said hydrogen-densified noble metal-containing liner is comprised of Ru and said conductive metal-containing material is comprised of Cu.

6. The method of claim 1 wherein said $H_2$-containing plasma comprises at least 95% or greater $H_2$.

7. The method of claim 6 wherein said $H_2$-containing plasma is mixed with an inert gas.

8. The method of claim 1 wherein said hydrogen-densified noble metal-containing material comprises one of Rh, Ir, Pt, Co, Pd and alloys thereof.

9. The method of claim 1 wherein the conductive metal-containing material is one of Cu, W, and Al.

10. The method of claim 1 wherein said aspect ratio is greater than 10:1.

11. The method of claim 1 wherein said hydrogen-densified noble metal-containing material comprises Ru.

\* \* \* \* \*